(12) United States Patent
Ben Abdelaziz

(10) Patent No.: US 10,102,986 B2
(45) Date of Patent: Oct. 16, 2018

(54) CONTROL PANEL WITH PRINTED LED FOR VEHICLE AND METHOD FOR CREATING SAME

(71) Applicant: FAURECIA INTERIEUR INDUSTRIE, Nanterre (FR)

(72) Inventor: Omar Ben Abdelaziz, Beauvais (FR)

(73) Assignee: Faurecia Interieur Industrie, Nanterre (FR)

( * ) Notice: Subject to any disclaimer, the term of this patent is extended or adjusted under 35 U.S.C. 154(b) by 0 days.

(21) Appl. No.: 15/248,547

(22) Filed: Aug. 26, 2016

(65) Prior Publication Data

US 2017/0062153 A1 Mar. 2, 2017

(30) Foreign Application Priority Data

Aug. 28, 2015 (FR) ...................... 15 58021

(51) Int. Cl.
*H01H 13/14* (2006.01)
*B05D 5/12* (2006.01)
(Continued)

(52) U.S. Cl.
CPC ............... *H01H 13/14* (2013.01); *B05D 5/12* (2013.01); *B60K 35/00* (2013.01); *B60K 37/06* (2013.01); *G06F 3/041* (2013.01); *H01H 9/181* (2013.01); *H03K 17/96* (2013.01); *H03K 17/9643* (2013.01); *B60K 2350/1036* (2013.01);
(Continued)

(58) Field of Classification Search
CPC .... H01H 13/14; H01H 9/181; H01H 2201/02; H01H 2219/037; H01H 2231/016; H03K 17/96; H03K 17/9643; H03K 2217/96019; H03K 2217/96023; H03K 2217/96042; B05D 5/12; B60K 35/00; B60K 37/06; B60K 2350/1036; B60K 2350/2039; G06F 3/041
USPC .................................................. 200/181, 600
See application file for complete search history.

(56) References Cited

U.S. PATENT DOCUMENTS 5,952,630 A * 9/1999 Filion .................. B60N 2/4693
200/302.1
8,408,723 B2 4/2013 Porter et al.
(Continued)

FOREIGN PATENT DOCUMENTS

DE 102007013078 A1 9/2008
DE 102008055865 A1 5/2010
(Continued)

OTHER PUBLICATIONS

French Search Report in French for application No. FR1558021, dated Jun. 21, 2016, 2 pages.
(Continued)

*Primary Examiner* — Edwin A. Leon
(74) *Attorney, Agent, or Firm* — Reising Ethington P.C.

(57) ABSTRACT

A control panel for a vehicle. The control panel includes a decorative layer and a control assembly. The decorative layer has a visible face and a rear face opposite to the visible face. The control assembly has a front face and a rear face opposite to the front face. The front face of the control assembly faces the rear face of the decorative layer. The control assembly is fixed to the decorative layer and includes a support film, a pressure sensor and a light-emitting diode. The pressure sensor and the light-emitting diode are printed on the support film.

20 Claims, 2 Drawing Sheets

(51) Int. Cl.
  *B60K 35/00*  (2006.01)
  *B60K 37/06*  (2006.01)
  *G06F 3/041*  (2006.01)
  *H03K 17/96*  (2006.01)
  *H01H 9/18*   (2006.01)

(52) U.S. Cl.
  CPC .. *B60K 2350/2039* (2013.01); *H01H 2201/02* (2013.01); *H01H 2219/037* (2013.01); *H01H 2231/016* (2013.01); *H03K 2217/96019* (2013.01); *H03K 2217/96023* (2013.01); *H03K 2217/96042* (2013.01)

(56) References Cited

U.S. PATENT DOCUMENTS

| | | | |
|---|---|---|---|
| 8,912,447 B2 * | 12/2014 | Leong | H03K 17/9622 174/254 |
| 2005/0134116 A1 | 6/2005 | Hein et al. | |
| 2010/0231528 A1 | 9/2010 | Wolfe et al. | |
| 2012/0217147 A1 | 8/2012 | Porter et al. | |
| 2013/0061679 A1 | 3/2013 | Steckel | |
| 2014/0126177 A1 | 5/2014 | Geyl et al. | |
| 2015/0096878 A1 | 4/2015 | Aliane et al. | |
| 2015/0339001 A1 | 11/2015 | Zirkl et al. | |
| 2016/0218712 A1 * | 7/2016 | Ben Abdelaziz | H01L 41/25 |

FOREIGN PATENT DOCUMENTS

| | | |
|---|---|---|
| DE | 102011050585 A1 | 11/2012 |
| DE | 102011079902 A1 | 1/2013 |
| WO | WO2011028366 A1 | 3/2011 |
| WO | WO2013058708 A1 | 4/2013 |
| WO | WO2014037016 A1 | 3/2014 |

OTHER PUBLICATIONS

Written Opinion in French for application No. FR1558021, dated Jun. 21, 2016, 4 pages.

* cited by examiner

CONTROL PANEL WITH PRINTED LED FOR VEHICLE AND METHOD FOR CREATING SAME

TECHNICAL FIELD

The present invention relates to a control panel, in particular for a vehicle. The invention also relates to a method for producing the control panel.

BACKGROUND

The control panel comprises at least one control button used in particular to turn vehicle equipment on or off, such as the rear window defrost system, seat heating, electronic stability control system of the vehicle, hazard lights, etc.

The control button comprises an element for detecting when the button is pressed in order to change the state of the equipment, and a backlit light signal associated with the button to inform the user of the state of the equipment and/or to indicate the location of the control button when it is dark.

Pushbutton-type control buttons are known; the control button constitutes a module which moves and which is visible as such.

Also known is a control panel with a unitary decorative front face comprising control areas in which it is possible to control the electric equipment by deformation of the front face. However, either the control area is offset relative to the light signal, which makes it difficult to detect the position of the control area when it is dark, or the method for producing the control panel is complex, difficult on an industrial scale, and/or not very robust.

In addition, document DE102011050585 discloses a control panel comprising:
- a decorative layer having a visible face and a rear face opposite to the visible face, and
- a control assembly comprising a front face and a rear face opposite to the front face, the front face of said control assembly facing the rear face of the decorative layer, said control assembly being fixed to the decorative layer and comprising a support film, a pressure sensor and a light-emitting diode (LED).

SUMMARY

The invention aims to provide a robust control panel that can be easily and reliably produced industrially while enabling detection of pressure and effectively lighting the same area of the decorative face.

To overcome the above problems, in at least some embodiments of the present invention the light-emitting diode and the pressure sensor are printed on the support film.

Thus, the light-emitting diode can be positioned relative to the pressure sensor during the printing operation on the support film, which allows a reliable relative positioning that is easily carried out industrially. In addition, the printing operation produces thin flat layers of consistent hardness, reducing the risk of damage to the light-emitting diode and pressure sensor when pressure is exerted on the visible face of the control panel.

Printing is understood to mean a deposition of material, in particular by screen printing, a jet of droplets of material, or a similar technique.

According to another feature of the invention, the control assembly preferably further comprises electrically conductive tracks printed on the support film and connected to the pressure sensor and to the light-emitting diode.

The control panel is thus produced in a simple and reliable manner.

According to an additional feature of the invention, the control panel further comprises a single connector, electrically connected to both the pressure sensor and light-emitting diode by electrically conductive tracks, said connector being intended to be connected to the electronic control unit of the vehicle.

The robustness of the control panel is thus improved and its installation in the vehicle is facilitated.

According to another feature of the invention, preferably the pressure sensor and light-emitting diode are superposed one onto the other on the support film.

The pressure sensor and light-emitting diode are thus created on the same side of the support film.

According to an alternative feature of the invention, preferably the pressure sensor and light-emitting diode are arranged on opposite faces of the support film, the light-emitting diode is arranged between the pressure sensor and the decorative layer, and the support film is flexible.

Thus, the printing of the pressure sensor and the printing of light-emitting diode do not interfere with each other but are easily positioned in a satisfactory manner with respect to one another. The pressure sensor does not interfere with the light emitted by the light-emitting diode. Deformation of the support film allows the pressure sensor to detect, in an effective manner, pressure exerted on the visible face.

According to another feature of the invention, preferably the front face of the control assembly is bonded to the rear face of the decorative layer.

Damage to the control assembly, and in particular to the light-emitting diode, is thus avoided by attaching the control assembly to the decorative layer, since the control assembly is not exposed to pressure and/or high temperatures.

In various embodiments of the control panel of the invention, one or more of the following arrangements may optionally be used:
- the light-emitting diode is an organic light-emitting diode (OLED);
- the pressure sensor is a piezoelectric sensor;
- the control panel comprises a plurality of pressure sensors and a plurality of light-emitting diodes, each pressure sensor controlling the turning on of a corresponding light-emitting diode arranged between said pressure sensor and the decorative layer;
- the control panel comprises a plurality of light-emitting diodes of different colors.

The invention further relates to a method for creating a control panel, in particular for a motor vehicle. The method comprises:
a) printing a pressure sensor and a light-emitting diode on a support film in order to create a control assembly, and
b) fixing the control assembly to a decorative layer.

Preferably, the method further comprises one or more of the following features:
- in step a), the pressure sensor and the light-emitting diode are made by deposition of material on the support film, such as screen printing or a jet of droplets of material;
- during step b), the control assembly is fixed to the decorative layer by adhesive bonding.

BRIEF DESCRIPTION OF THE DRAWINGS

Other features and advantages of the invention will become apparent in the following detailed description, referring to the accompanying drawings in which.

DETAILED DESCRIPTION OF THE ILLUSTRATED EMBODIMENTS

Figure 1:
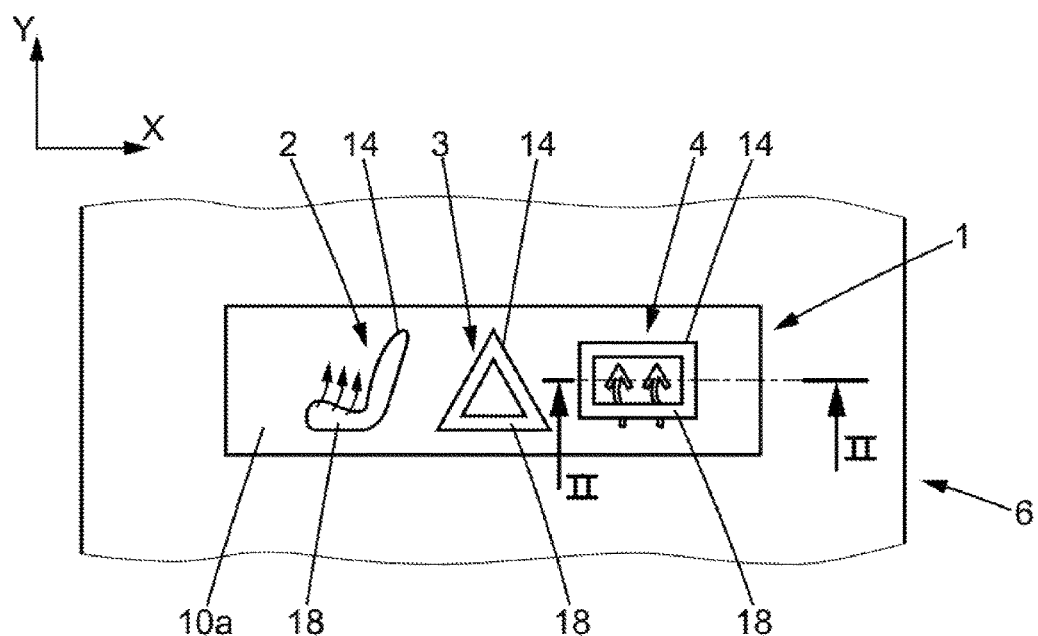
FIG. 1 represents a control panel according to an embodiment of the invention, arranged on a center console of a motor vehicle.

FIG. 1 illustrates a control panel 1 in a motor vehicle, more specifically on a center console 6.

The control panel 1 has a visible face 10a forming a visible front face. The control panel 1 comprises a plurality of control areas 2, 3, 4, three control areas in the illustrated embodiment, in line along a longitudinal direction X. Each of the control areas comprises a backlit control button 8 having a selectively illuminated icon and capable of detecting pressure applied in a control direction Z on the visible face 10a of the control area 2, 3, 4 of the corresponding backlit control button 8. The control direction Z is perpendicular to the longitudinal direction X. The visible face 10a extends in the longitudinal direction X and in a direction Y that is perpendicular to the longitudinal direction and to the control direction Z.

Figure 2:
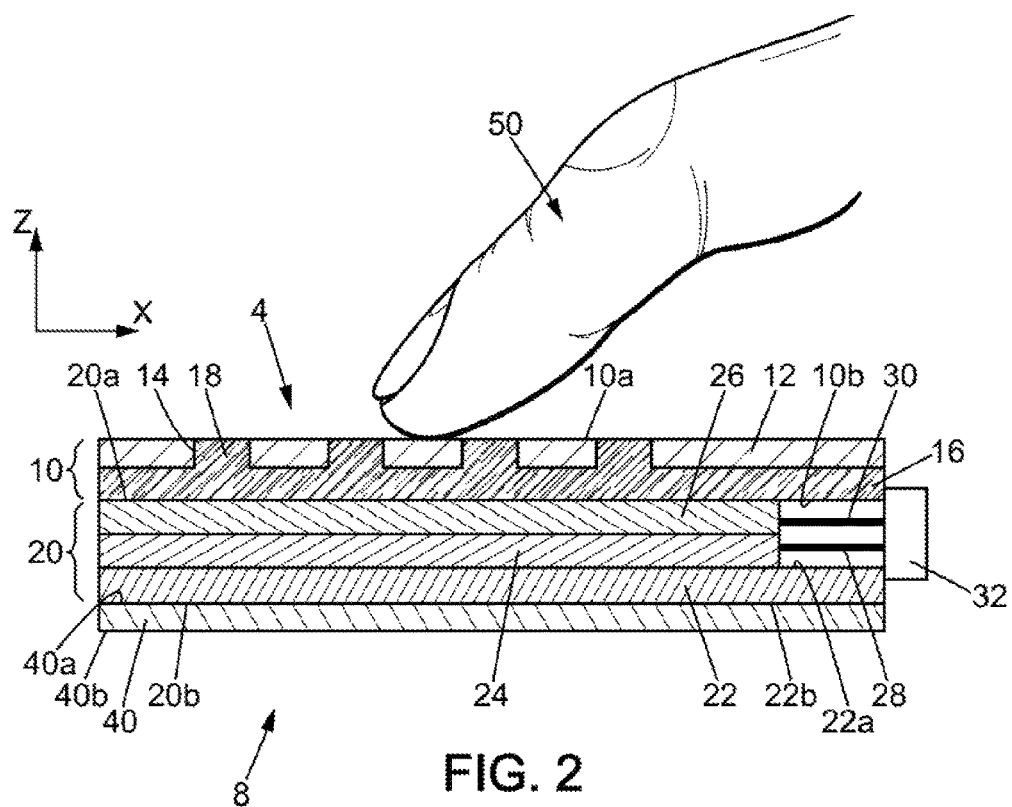
FIG. 2 is a schematic sectional representation of the control panel along the line referenced II-II in FIG. 1, according to a first embodiment.
Figure 3:
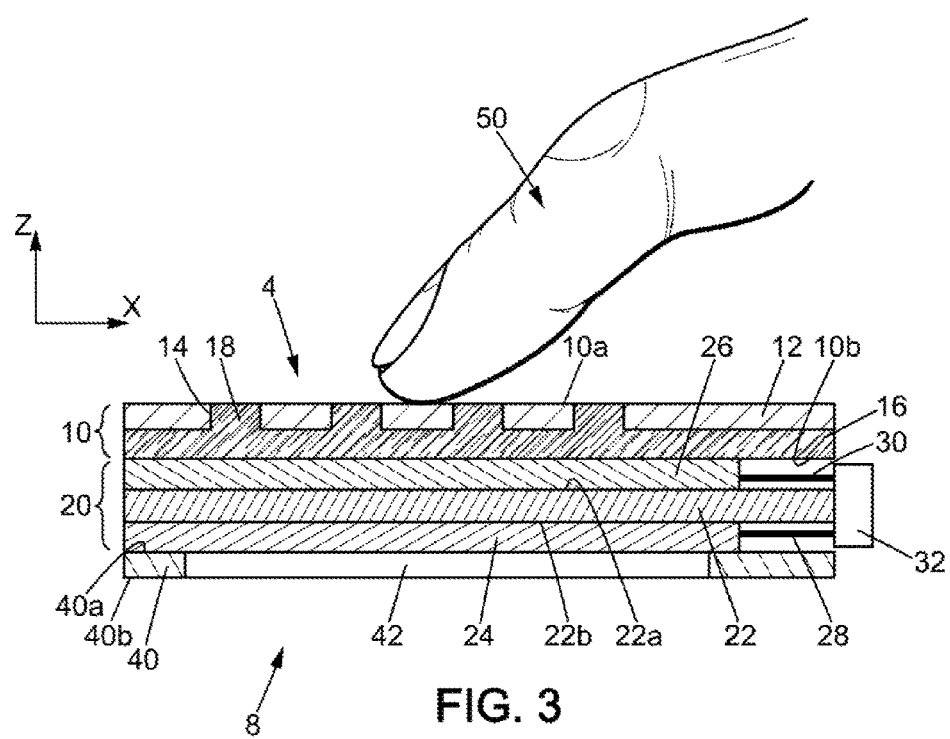
FIG. 3 is a representation similar to FIG. 2 of the control panel, according to a second embodiment.

As can be seen in FIGS. 2 and 3, the control panel 1 essentially comprises a decorative layer 10, a control assembly 20, and a support 40.

The decorative layer 10 has the visible face 10a and a rear face 10b opposite to the visible face 10a, which both extend substantially perpendicular to the control direction Z. Alternatively, the visible face may not be planar. The decorative layer comprises an opaque layer 12 and a transparent (or translucent) layer 14. In the embodiments illustrated in FIGS. 2 and 3, the opaque layer 12 consists of a metal plate of substantially constant thickness, preferably of aluminum less than 1 mm thick, preferably slightly less than 0.5 mm. The opaque layer 12 comprises at least one through-hole 14 per control area 2, 3, 4, of a shape corresponding to the icons to be displayed. The transparent layer 14 is a single piece, preferably of plastic, in particular polycarbonate, comprising a plate of substantially constant thickness along the control direction Z and portions 18 projecting from the plate and extending through the through-holes 14 to lie flush with the metal plate 12. The visible face 10a is therefore formed by the opaque layer 12 and the projecting portions 18 of the transparent layer 14. Alternatively, the opaque layer 12 could be formed by a thin layer of opaque material that is deposited, preferably by screen printing, on the transparent layer 14 which would then have no projecting portions.

The control assembly 20 comprises a front face 20a and a rear face 20b opposite to the front face 20a. The control assembly 20 essentially comprises a support film 22 supporting a pressure sensor 24 and at least one light-emitting diode 26 per control area 2, 3, 4.

The support film 22 comprises a front face 22a, and a rear face 22b opposite to the front face 22a. It is electrically insulating, consisting of a thin layer of transparent plastic about 0.1 millimeter to a few tenths of a millimeter thick, and is flexible.

Each pressure sensor 24 consists of a piezoelectric element printed on the support film 22 and having a thickness of about 0.1 millimeter. The piezoelectric elements are connected to an electrical connector 32 by conductive tracks 28 also carried by the support film 22 and produced by printing.

The light-emitting diodes 26 are connected to the electrical connector 32 by conductive tracks 30 carried by the support film 22 and created by printing. The light-emitting diodes are preferably the organic type (OLED) composed of several layers printed on the support film 22. In each control area 2, 3, 4, the light-emitting diodes 26 are arranged between the decorative layer 10 and the pressure sensors 24 along the control direction Z. More specifically, the light-emitting diodes 26 define the front face 20a of the control assembly 20. In addition, for each control area 2, 3, 4, the control assembly preferably comprises a plurality of organic light-emitting diodes of different colors and separately controlled in order to illuminate the icon with different colors on the visible face 10a.

The support 40 comprises a front face 40a and a rear face 40b opposite to the front face 40a along the control direction Z. The front face 40a is fixed to the rear face 20b of the control assembly 20, preferably by adhesive bonding. The support 40 has a substantially constant thickness along the control direction Z, preferably between 1 and 2 millimeters. However, in the embodiment shown in FIG. 3, the support 40 comprises cavities 42, in other words holes, so as to make room for the rear face 20b of the control assembly 20 at the pressure sensors 24 in order to facilitate their deformation. The support 40 is made of opaque thermoplastic material, preferably consisting of a blend of polycarbonate and acrylonitrile butadiene styrene. In the embodiment illustrated in FIG. 2, the pressure sensors 24 are printed on the front face 22a of the support film 22 with the conductive tracks 28, then the light-emitting diodes 26 are printed on the pressure sensors 24 with the conductive tracks 30. The rear face 22b of the support film forms the rear face 20b of the control assembly 20. Next, the front face 20a of the control assembly 20 is bonded to the rear face 10b of the decorative layer 10, and the front face 40a of the support 40 is bonded to the rear face 20b of the control assembly 20. As illustrated in FIG. 2, when a user presses his or her finger 50 on the visible face 10a in one of control areas 2, 3, 4, pressure is applied to the decorative layer 10 and it deforms slightly. The pressure is passed on, causing deformation of the light-emitting diode 26 and of the pressure sensor 24 which detects this pressure and sends an electrical signal to the vehicle's electronic control unit via the conductive tracks 28 and the electrical connector 32. The vehicle's electronic control unit accordingly sends a signal to the corresponding light-emitting diodes 26.

In the embodiment illustrated in FIG. 3, the pressure sensors 24 are printed on the rear face 22b of the support film 22 with the conductive tracks 28, while the light-emitting diodes 26 are printed on the front face 22a of the support film 22 with the conductive tracks 30. The pressure sensors 24 constitute the rear face 20b of the control assembly 20. Next, the front face 20a of the control assembly 20 is bonded to the rear face 10b of the decorative layer 10, and the front face 40a of the support 40 is bonded to the rear face 20b of the control assembly 20, with the cavities 42 below the pressure sensors 24. As shown in FIG. 3, when a user 50 presses his or her finger on the visible face 10a in one of the control areas 2, 3, 4, pressure is applied to the decorative layer 10 and it deforms slightly. The pressure is passed on by deformation through the light-emitting diode 26 and the support film 22 to the pressure sensor 24 which detects this pressure and sends an electrical signal to the vehicle's electronic control unit via the conductive tracks 28 and the electrical connector 32. The vehicle's electronic control unit accordingly sends a signal to the corresponding light-emitting diodes 26.

The printing operation consists of depositing a thin layer of material, preferably by an operation of screen printing, an operation of applying a jet of droplets of material, or by a similar operation.

The invention claimed is:

1. Control panel for a vehicle, said control panel comprising:
   a decorative layer having a visible face and a rear face opposite to the visible face,
   a control assembly comprising a front face and a rear face opposite to the front face, the front face of said control assembly facing the rear face of the decorative layer, said control assembly being fixed to the decorative layer and comprising a support film, a pressure sensor, and a light-emitting diode,
   wherein the pressure sensor and the light-emitting diode are printed on the support film and the pressure sensor is a piezoelectric sensor.

2. Control panel according to claim 1, wherein the control assembly further comprises electrically conductive tracks printed on the support film and connected to the pressure sensor and to the light-emitting diode.

3. Control panel for a vehicle, said control panel comprising:
   a decorative layer having a visible face and a rear face opposite to the visible face,
   a control assembly comprising a front face and a rear face opposite to the front face, the front face of said control assembly facing the rear face of the decorative layer, said control assembly being fixed to the decorative layer and comprising a support film, a pressure sensor, and a light-emitting diode, wherein the pressure sensor and the light-emitting diode are printed on the support film,
   electrically conductive tracks printed on the support film and connected to the pressure sensor and to the light-emitting diode, and
   a single connector, electrically connected to both the pressure sensor and the light-emitting diode by said electrically conductive tracks, said connector being intended to be connected to the electronic control unit of the vehicle.

4. Control panel according to claim 1, wherein the pressure sensor and the light-emitting diode are superposed one onto the other on the support film.

5. Control panel for a vehicle, said control panel comprising:
   a decorative layer having a visible face and a rear face opposite to the visible face,
   a control assembly comprising a front face and a rear face opposite to the front face, the front face of said control assembly facing the rear face of the decorative layer, said control assembly being fixed to the decorative layer and comprising a support film, a pressure sensor, and a light-emitting diode,
   wherein:
   the pressure sensor and the light-emitting diode are printed on the support film,
   the pressure sensor and the light-emitting diode are arranged on opposite faces of the support film,
   the light-emitting diode is arranged between the pressure sensor and the decorative layer, and
   the support film is flexible.

6. Control panel according to claim 1, wherein the front face of the control assembly is bonded to the rear face of the decorative layer.

7. Control panel according to claim 1, wherein the light-emitting diode is an organic light-emitting diode.

8. Control panel according to claim 3, wherein the pressure sensor is a piezoelectric sensor.

9. Method for creating the control panel according to claim 1, said method comprising:
   a) creating the control assembly by printing the pressure sensor and the light-emitting diode onto the support film, and
   b) fixing the control assembly to the decorative layer.

10. Method according to claim 9, wherein, in step a), the pressure sensor and the light-emitting diode are made by depositing material on the support film.

11. Method according to claim 10, wherein the step of depositing of material comprises screen printing the material onto the support film or depositing a jet of droplets of material onto the support film.

12. Method for creating a control panel, said method comprising:
   a) creating a control assembly by printing a piezoelectric pressure sensor and a light-emitting diode onto a support film, wherein the control assembly comprises a front face and a rear face opposite the front face, and
   b) fixing the control assembly to a decorative layer having a visible face and a rear face opposite the visible face, wherein the front face of the control assembly faces the rear face of the decorative layer.

13. Method according to claim 12, wherein, in step a), the pressure sensor and the light-emitting diode are made by depositing material on the support film.

14. Method according to claim 13, wherein the step of depositing of material comprises screen printing the material onto the support film or depositing a jet of droplets of material onto the support film.

15. Control panel according to claim 3, wherein the front face of the control assembly is bonded to the rear face of the decorative layer.

16. Control panel according to claim 3, wherein the light-emitting diode is an organic light-emitting diode.

17. Control panel according to claim 5, wherein the control assembly further comprises electrically conductive tracks printed on the support film and connected to the pressure sensor and to the light-emitting diode.

18. Control panel according to claim 5, wherein the pressure sensor and the light-emitting diode are superposed one onto the other on the support film.

19. Control panel according to claim 5, wherein the front face of the control assembly is bonded to the rear face of the decorative layer.

20. Control panel according to claim 5, wherein the light-emitting diode is an organic light-emitting diode.

* * * * *